United States Patent
Saitou et al.

(10) Patent No.: US 11,552,234 B2
(45) Date of Patent: *Jan. 10, 2023

(54) THERMOELECTRIC CONVERSION ELEMENT AND THERMOELECTRIC CONVERSION MODULE

(71) Applicant: Panasonic Intellectual Property Management Co., Ltd., Osaka (JP)

(72) Inventors: Yui Saitou, Kyoto (JP); Yoshihiro Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 466 days.

This patent is subject to a terminal disclaimer.

(21) Appl. No.: 16/125,303

(22) Filed: Sep. 7, 2018

(65) Prior Publication Data

US 2020/0028056 A1 Jan. 23, 2020

Related U.S. Application Data

(63) Continuation of application No. PCT/JP2017/009920, filed on Mar. 13, 2017.

(Continued)

(51) Int. Cl.
*H01L 35/30* (2006.01)
*H01L 35/32* (2006.01)
(Continued)

(52) U.S. Cl.
CPC .............. *H01L 35/32* (2013.01); *H01L 35/08* (2013.01); *H01L 35/16* (2013.01); *H01L 35/34* (2013.01)

(58) Field of Classification Search
CPC ......... H01L 35/32; H01L 35/08; H01L 35/16; H01L 35/34
See application file for complete search history.

(56) References Cited

U.S. PATENT DOCUMENTS

2005/0211288 A1* 9/2005 Tateyama ............... H01L 35/32
                                                        136/212
2008/0017236 A1* 1/2008 Perlo ...................... H01L 35/30
                                                        136/201
(Continued)

FOREIGN PATENT DOCUMENTS

JP       2012-231121 A       11/2012
JP       2013-542578 A       11/2013
(Continued)

OTHER PUBLICATIONS

International Search Report and Written Opinion issued in Application No. PCT/JP2017/009920 dated May 30, 2017.

*Primary Examiner* — Thanh Truc Trinh
(74) *Attorney, Agent, or Firm* — McDermott Will & Emery LLP

(57) ABSTRACT

A thermoelectric conversion element includes: a thermoelectric member that is columnar; an insulator formed around the thermoelectric member; and a metal layer formed continuously on an edge surface of the thermoelectric member and an edge surface of the insulator. An edge portion of the thermoelectric member and an edge portion of the insulator define a gap covered with the metal layer. The inner portion of the gap covered with the metal layer is a void.

19 Claims, 7 Drawing Sheets

Related U.S. Application Data

(60) Provisional application No. 62/308,412, filed on Mar. 15, 2016.

(51) Int. Cl.
*H01L 35/08* (2006.01)
*H01L 35/16* (2006.01)
*H01L 35/34* (2006.01)

(56) References Cited

U.S. PATENT DOCUMENTS

| | | | |
|---|---|---|---|
| 2010/0059096 A1* | 3/2010 | Fukada | H01L 35/08 136/205 |
| 2011/0139206 A1* | 6/2011 | Ukita | H01L 35/06 136/224 |
| 2012/0263207 A1 | 10/2012 | Higashida et al. | |
| 2013/0014796 A1 | 1/2013 | Tajima | |
| 2013/0199593 A1 | 8/2013 | Higashida et al. | |
| 2014/0216515 A1* | 8/2014 | Ochi | H01L 35/08 136/205 |

FOREIGN PATENT DOCUMENTS

| | | |
|---|---|---|
| JP | 5377753 B2 | 12/2013 |
| WO | 2011/118341 A1 | 9/2011 |

\* cited by examiner

THERMOELECTRIC CONVERSION ELEMENT AND THERMOELECTRIC CONVERSION MODULE

CROSS REFERENCE TO RELATED APPLICATIONS

This application is a United States continuation application of PCT International Patent Application Number PCT/JP2017/009920 filed on Mar. 13, 2017, claiming the benefit of priority of U.S. Provisional Application No. 62/308,412 filed on Mar. 15, 2016, the entire contents of which are hereby incorporated by reference.

BACKGROUND

1. Technical Field

The present disclosure relates to a thermoelectric conversion element and a thermoelectric conversion module.

2. Description of the Related Art

A thermoelectric conversion module uses a thermoelectric conversion element that utilizes the Seebeck effect or the Peltier effect. Since the thermoelectric conversion element is simple in structure, easy to handle, and capable of maintaining its stable properties, the use of the thermoelectric conversion element over a wide range has gained attention in recent years. This includes in particular the use for exhaust heat recovery at refuse disposal facilities and cooling of laser diodes.

Note that Japanese Unexamined Patent Application Publication No. 2012-231121 discloses a thermoelectric conversion module used for cooling purposes by utilizing the Peltier effect described above. As illustrated in FIG. 6, the thermoelectric conversion module disclosed in Japanese Unexamined Patent Application Publication No. 2012-231121 has a configuration in which a plurality of pairs of pn elements are arranged in series by joining p-type thermoelectric conversion elements 50-p having the p-type properties and n-type thermoelectric conversion elements 50-n having the n-type properties via contact electrodes 50-1 and solder, for example. Extraction terminals 60-1 and 60-1' are connected to contact electrodes 50-1 located at both ends of the series arrangement. Further, contact electrodes 50-1 are sandwiched from the outside between high-temperature-side ceramic substrate 50-2H and low-temperature-side ceramic substrate 50-2C which make up a pair of wiring substrates.

At this time, by supplying a current from extraction terminals 60-1 and 60-1', it is possible to, for example, increase the temperature of high-temperature-side ceramic substrate 50-2H and decrease the temperature of low-temperature-side ceramic substrate 50-2C. In other words, it is possible to provide a temperature difference. By bringing low-temperature-side ceramic substrate 50-2C into contact with a target object to be cooled, the thermoelectric conversion module cools down the target object.

Used as the material of p-type thermoelectric conversion elements 50-p and n-type thermoelectric conversion elements 50-n is a material having a large figure of merit Z ($=\alpha^2/\rho K$) represented by Seebeck coefficient $\alpha$, resistivity $\rho$, and thermal conductivity K which are constants peculiar to the substance in the use temperature range. In particular, in the thermoelectric conversion module utilizing the Peltier effect, a bismuth telluride (BiTe)-based material is generally used as a thermoelectric member.

Note that since the BiTe-based material is a brittle material and its reactivity with solder is high, it is a known technique, as illustrated in FIG. 7, to form insulator 70-2 made of an insulating material such as glass or an epoxy resin around thermoelectric member 70-1 sandwiched between metal films 70-3 (International Publication WO2011/118341).

SUMMARY

However, since the BiTe-based material, which is the thermoelectric member, and the insulator are different in expansion coefficient, the thermoelectric member tends to stretch beyond the insulator in the usage environment where the temperature reaches close to 100° C. and in the modularization process where the temperature reaches 300° C. or higher. As a consequence, a large stress is generated in the insulating material, resulting in a problem that the insulating material is damaged during use or after completion of the module.

The present disclosure has been conceived to solve the above problem and has an object to provide a thermoelectric conversion element and a thermoelectric conversion module of high quality with less damage etc. to the insulating material.

A thermoelectric conversion element according to an aspect of the present disclosure includes: a thermoelectric member that is columnar; an insulator formed around the thermoelectric member; and a metal layer formed continuously on an edge surface of the thermoelectric member and an edge surface of the insulator. An edge portion of the thermoelectric member and an edge portion of the insulator define a gap covered with the metal layer, and an inner portion of the gap covered with the metal layer is a void.

The metal layer may extend into the inner portion of the gap from an edge of the edge surface of the thermoelectric member and an edge of the edge surface of the insulator.

The metal layer may be formed on (i) the edge surface of the thermoelectric member, (ii) a part of the edge portion of the thermoelectric member, and (iii) a part of the edge portion of the insulator.

The gap may include a first portion and a second portion. The first portion may be located closer to the edge surface of the thermoelectric member than the second portion is and may have a volume greater than a volume of the second portion. The second portion may be located closer to a longitudinal central portion of the thermoelectric member than the first portion is.

The metal layer may include a plurality of layers.

The plurality of layers may include a first metal layer and a second metal layer, the second metal layer being formed across the first metal layer from the thermoelectric member. The first metal layer may have a density of nickel (Ni) higher than a density of Ni of the second metal layer.

The first metal layer may have a thickness in a range of 5 nm to 1 µm.

A high adhesion layer may be included between the first metal layer and the thermoelectric member, the high adhesion layer having an adhesion strength greater than an adhesion strength of a Ni layer.

The high adhesion layer may include titanium (Ti), molybdenum (Mo), chromium (Cr), or titanium nitride (TiN).

Further, a thermoelectric conversion element according to an aspect of the present disclosure includes: a thermoelectric member that is columnar; an insulator formed in a tubular shape around the thermoelectric member; a metal layer formed continuously on an edge surface of the thermoelectric member and an edge surface of the insulator. The edge surface of the insulator protrudes beyond the edge surface of the thermoelectric member.

Furthermore, a thermoelectric conversion module according to an aspect of the present disclosure includes: a first wiring substrate; a second wiring substrate opposed to the first wiring substrate; and a plurality of thermoelectric conversion elements arrayed between the first wiring substrate and the second wiring substrate, the plurality of thermoelectric conversion elements each being one of the thermoelectric conversion elements described above.

With a thermoelectric conversion element and a thermoelectric conversion module according to the present disclosure, it is possible to provide a thermoelectric conversion element of high quality with no cracks or fracture in the insulator.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF EMBODIMENT

Hereinafter, an embodiment of the present disclosure is described with reference to the drawings.

Figure 1:
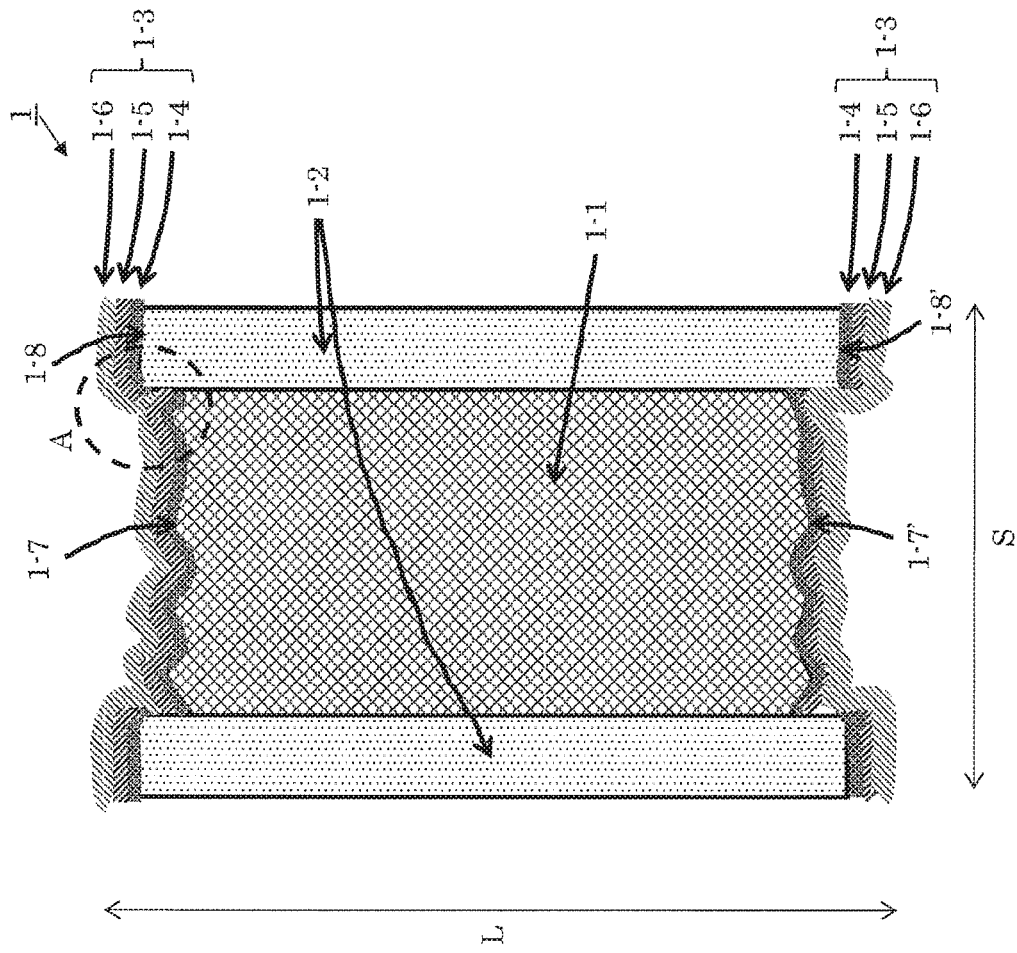
FIG. 1 is a cross-sectional view of a thermoelectric conversion element according to an embodiment.

FIG. 1 is a cross-sectional view of thermoelectric conversion element 1 according to the present embodiment. Thermoelectric conversion element 1 includes thermoelectric member 1-1 that is columnar, insulator 1-2 formed around thermoelectric member 1-1, and metal layers 1-3 serving as electrodes in close contact with thermoelectric member 1-1 and insulator 1-2.

Thermoelectric member 1-1 is a columnar member having thermoelectric conversion properties, that is, thermoelectric member 1-1 is capable of generating a temperature difference between the edge surfaces of thermoelectric conversion element 1 when a current passes through thermoelectric member 1-1; and passing a current through thermoelectric member 1-1 when a temperature difference is generated at the edge surfaces of thermoelectric conversion element 1. There are a p-type thermoelectric member and an n-type thermoelectric member as thermoelectric member 1-1.

A BiTe-based material is generally used as both the p-type and n-type thermoelectric members. Specifically, Sb-doped $Bi_{0.5}Sb_{1.5}Te_3$ is used as the p-type thermoelectric member, and Se-doped $Bi_2Te_{2.7}Se_{0.3}$ is used as the n-type thermoelectric member.

Note that, in the present embodiment, although these BiTe-based materials may be used as thermoelectric member 1-1, materials are not particularly limited, and materials such as a CoSb-based material, a PdTe-based material, and a MnSi-based material are also applicable, as long as such materials have the thermoelectric conversion properties.

Further, in some cases, the general composition of the BiTe-based material may include: various elements added for further improving the thermoelectric properties; or a binder such as a carbon nanotube, fullerene, or glass frit for strengthening the material.

Further, the shape of thermoelectric conversion element 1 is not particularly limited to a prism or a cylinder, for example, but in consideration of the effect of alleviating stress concentration etc., thermoelectric conversion element 1 may have a cylindrical shape.

In addition, the material of insulator 1-2 is not particularly limited to an inorganic material such as ceramics and glass, or a polymeric material typified by epoxy, as long as it is an insulator material. However, from the viewpoint of strength and reliability, quartz glass, heat-resistant glass (a material that is a type of borosilicate glass in which $SiO_2$ and $B2O_3$ are mixed and that has an expansion coefficient of about $3 \times 10^{-6}/K$), PYREX manufactured by Corning (registered trademark), etc. may be used.

Furthermore, although the thickness of insulator 1-2 is not particularly limited, insulator 1-2 may be as thin as possible because the presence of insulator 1-2 in thermoelectric conversion element 1 or the thermoelectric conversion module adversely affects the properties. Meanwhile, since the mechanical strength is required, the thickness of insulator 1-2 is desirably in a range of 0.01 mm to 10 mm. The thickness of insulator 1-2 is more desirably in a range of 0.015 mm to 3 mm.

In addition, width S and height L of tubular thermoelectric conversion element 1 are designed according to the electrical performance and the restrictions on the size in use of each module, and are therefore not particularly limited. However, width S is desirably in a range of 0.1 mm to 10 mm, and height L is desirably in a range of 0.1 mm to 10 mm.

One edge surface 1-8 of insulator 1-2 protrudes beyond one edge surface 1-7 of thermoelectric member 1-1. The other edge surface 1-8' of insulator 1-2 protrudes beyond the other edge surface 1-7' of thermoelectric member 1-1. This is to increase the area of contact between the solder or the like used for bonding with the substrate electrodes and the edge surfaces of thermoelectric conversion element 1 when modularization is to be performed after the formation of metal layers 1-3 etc., and to thereby improve the reliability.

Figure 3:
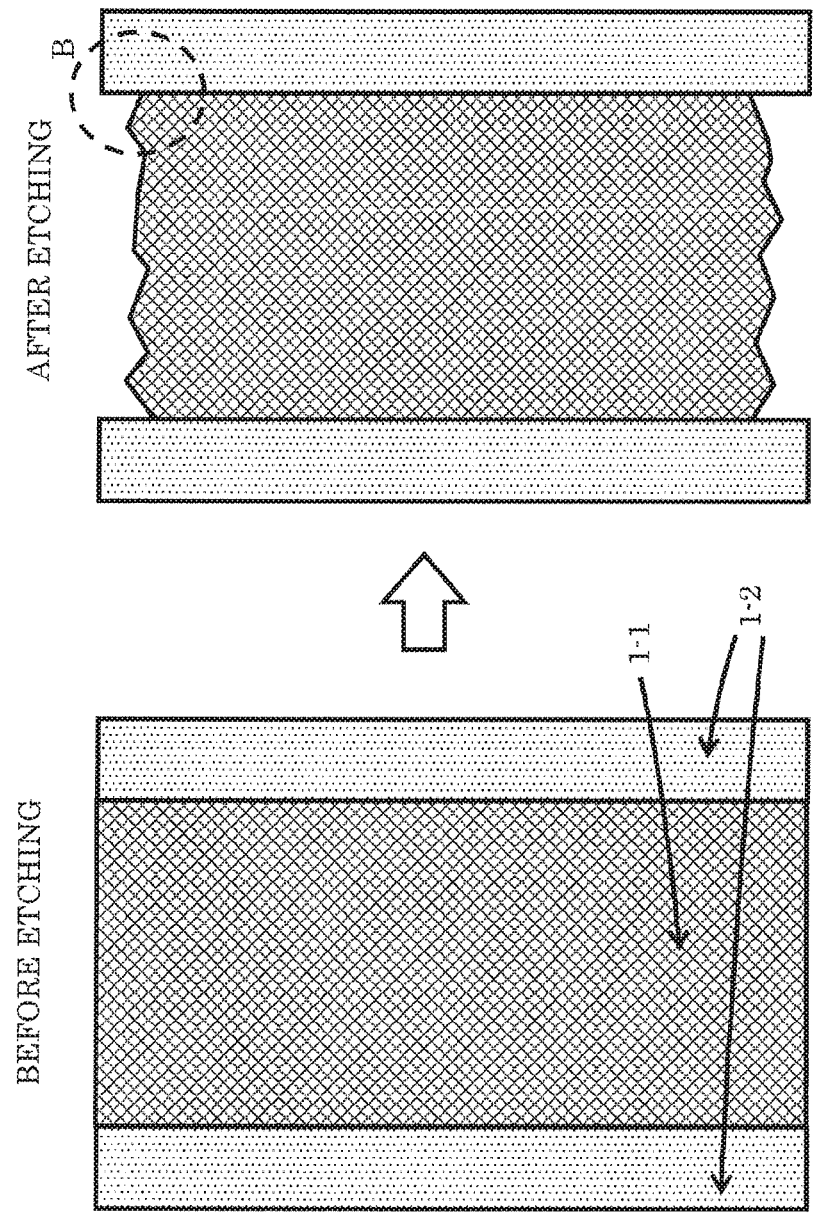
FIG. 3 is a diagram illustrating a change in shape of the thermoelectric conversion element according to the embodiment before and after etching.

Note that in order to form the structure in which the edge surfaces of insulator 1-2 protrude beyond the edge surfaces of thermoelectric member 1-1, a thermoelectric conversion element which initially has no step between the edge surfaces of insulator 1-2 and the edge surfaces of thermoelectric member 1-1 is formed as illustrated in FIG. 3. Thereafter, part of thermoelectric member 1-1 is dissolved using an etchant capable of dissolving thermoelectric member 1-1, such as sulfuric acid, nitric acid, hydrogen peroxide solution, or ammonium fluoride. Thereafter, washing with pure water etc. allows one edge surface 1-8 and the other edge surface 1-8' of insulator 1-2 to protrude. As for the etchant, there is no limitation on the type, so long as the etchant can be washed away afterward.

Note that when dissolving part of thermoelectric member 1-1 using the etchant, not only does the etchant dissolve one edge surface 1-7 and the other edge surface 1-7' of thermoelectric member 1-1 but it enters the interface between thermoelectric member 1-1 and insulator 1-2 due to a capillary phenomenon. Therefore, the dissolution proceeds more actively at the interface.

Figure 4:
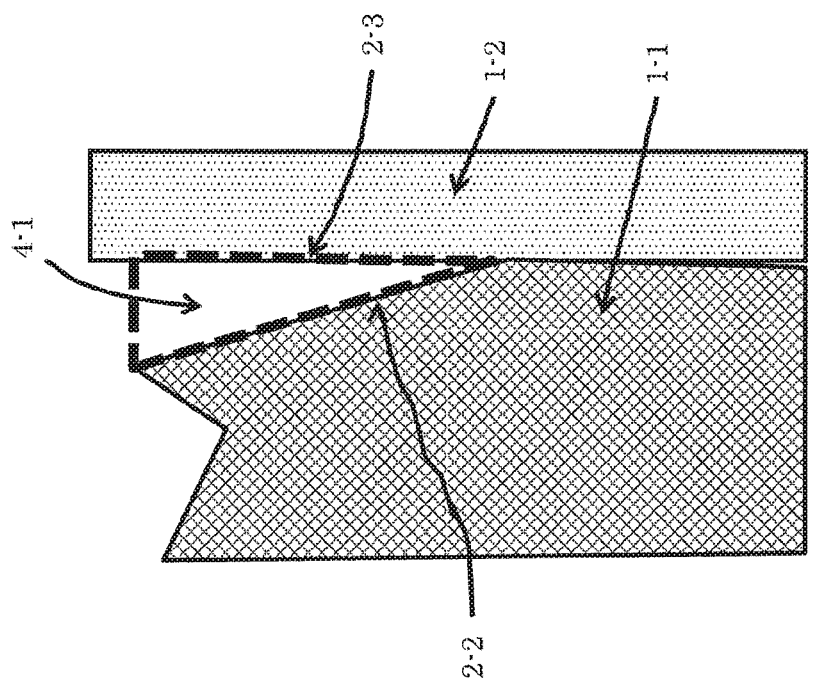
FIG. 4 is an enlarged view of portion B in FIG. 3.

As a result, as illustrated in FIG. 4, it is possible to form V groove 4-1, that is a void, between thermoelectric member edge portion 2-2 and insulator edge portion 2-3, at the interface between thermoelectric member 1-1 and insulator 1-2.

Figure 2:
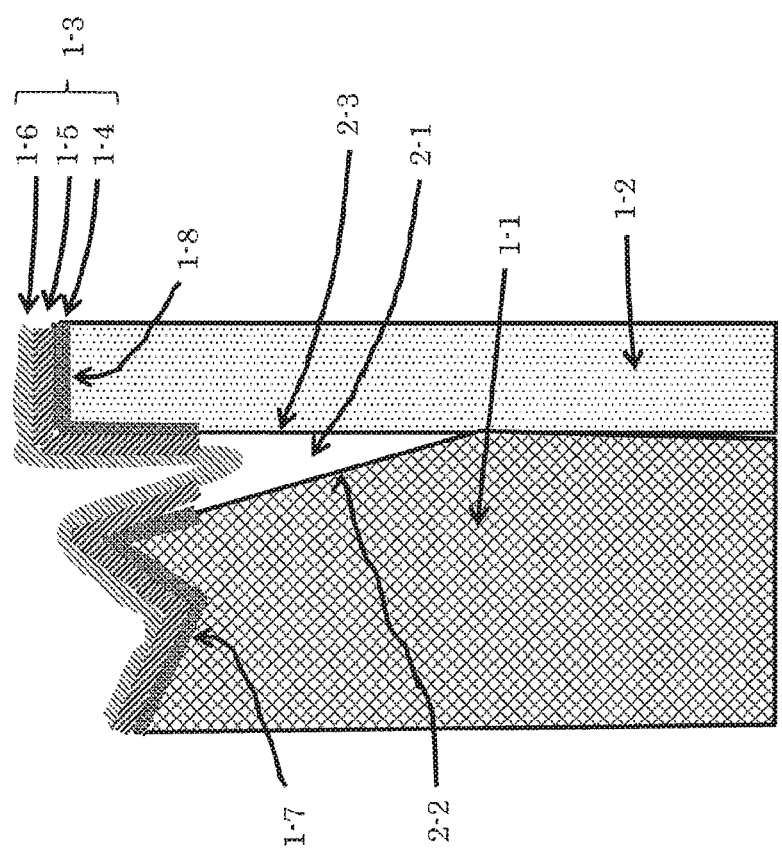
FIG. 2 is an enlarged view of portion A in FIG. 1.

As illustrated in FIG. 1 and FIG. 2, metal layer 1-3 is continuously formed on one edge surface 1-7 of thermoelectric member 1-1 and one edge surface 1-8 of insulator 1-2. As a result, void 2-1 is secured at the interface between thermoelectric member 1-1 and insulator 1-2.

Even when thermoelectric member 1-1 and insulator 1-2 have different expansion coefficients, the presence of void 2-1 can alleviate the stress generated in insulator 1-2 when the thermoelectric member tries to stretch beyond the insulator in the usage environment where the temperature reaches close to 100° C. and in the modularization process where the temperature reaches 300° C. or higher. Therefore, it is possible to suppress damage to insulator 1-2.

As illustrated in FIG. 2, metal layer 1-3 may extend into the inner portion of void 2-1 from an edge of the edge surface of thermoelectric member 1-1 and an edge of the edge surface of insulator 1-2. This increases the area of contact between thermoelectric member 1-1 and metal layer 1-3 as compared with the structure having no void 2-1, thus making it possible to increase the adhesion between thermoelectric member 1-1 and metal layer 1-3. In addition, the presence of void 2-1 can significantly reduce a decrease in adhesion between thermoelectric member 1-1 and metal layer 1-3.

Note that the material of metal layer 1-3 is not particularly limited in terms of the type of the element, so long as it has a function as a barrier film to prevent reaction between the BiTe-based material and a solder material used in modularization performed afterward and has no problem in bonding with the solder material. The material of metal layer 1-3 may be a single metal or an alloy.

However, metal layer 1-3 may include a plurality of layers and may be, as a metal type, a metal film containing, as a main component, nickel (Ni) having excellent barrier properties.

Furthermore, metal layer 1-5, which is a layer having a higher density of Ni, may be formed closer to the edge surface of thermoelectric member 1-1, and metal layer 1-6, which is a layer having a lower density of Ni, may be formed farther from the edge surface of thermoelectric member 1-1.

Metal layer 1-5 is formed by, for example, a sputtering method, a vapor deposition method, a thermal spraying method, or an electrolytic plating method, and the element ratio of Ni is 99% or higher. With this, metal layer 1-5 can be formed as a dense and stable film. The film thickness of metal layer 1-5 is desirably in a range of 5 nm to 1 μm.

Although metal layer 1-5 is dense, it has a large film stress and thus tends to peel off easily, and having a thickness greater than 1 μm may cause film peeling. Meanwhile, when modularizing thermoelectric conversion element 1, thermal diffusion etc. of heat from soldering used for bonding thermoelectric conversion element 1 and the substrate may cause a loss of Ni if metal layer 1-5 is thin, and thus the thickness of Ni needs to be greater than 1 μm. From this viewpoint, metal layer 1-6 is formed on metal layer 1-5 by electroless plating with a low element ratio of Ni and a small internal stress.

The thickness of metal layer 1-6 is desirably in a range of 100 nm to 100 μm. When the thickness of metal layer 1-6 is less than 100 nm, the effect of increasing the Ni thickness by metal layer 1-6 is not so significant, and there is a possibility of a partial loss of Ni. On the other hand, when the thickness of metal layer 1-6 is greater than 100 μm, the plating grows not only in the thickness direction but also in the lateral direction, and thus grows largely beyond insulator 1-2, thereby bringing about a possibility of malfunction such as short-circuiting etc. in the subsequent modularizing process.

Note that Ni formed by electroless plating contains P, B, etc. other than Ni, but the element contained in Ni is not limited in particular. Further, the electroless plating forming method may be a method in which the plating proceeds using the Ni element of metal layer 1-5 as a catalyst.

Meanwhile, since electroless plating is generally performed using a strong acidic solution, Ni may partially elute. Particularly when metal layer 1-5 thinner than 5 nm is formed, Ni of metal layer 1-5 elutes completely, and thus electroless plating, in which plating proceeds using the Ni element as a catalyst, does not proceed. From this viewpoint, the thickness of metal layer 1-5 is desirably 5 nm or greater.

Further, high adhesion layer 1-4 having an adhesion strength greater than the adhesion strength of the Ni layer may be formed between metal layer 1-5 and thermoelectric member 1-1. When thermoelectric member 1-1 is etched, a part of the surface may still be in the oxidized state due to the use of a chemical solution having strong oxidizing power. High adhesion layer 1-4 includes one or more types of elements among titanium (Ti), molybdenum (Mo), titanium nitride (TiN), and chromium (Cr) which are capable of strongly bonding with thermoelectric member 1-1 even when a part of the surface is still in the oxidized state. Note that although these elements are capable of strongly bonding with thermoelectric member 1-1, they have a disadvantage that oxidation easily occurs when they are alone, and thus high adhesion layer 1-4 may be formed by a vacuum process such as a sputtering method, a vapor deposition method, and a vacuum spraying method. Among the above elements, Ti in particular has not only high adhesion but also excellent barrier properties, and may be used as the high adhesion layer.

By forming high adhesion layer 1-4 having the above configuration, it is possible to firmly adhere thermoelectric member 1-1 and metal layer 1-3.

With the above configuration, it is possible to realize high-quality thermoelectric conversion element 1 including insulator 1-2 free from cracking and chipping.

Figure 5:
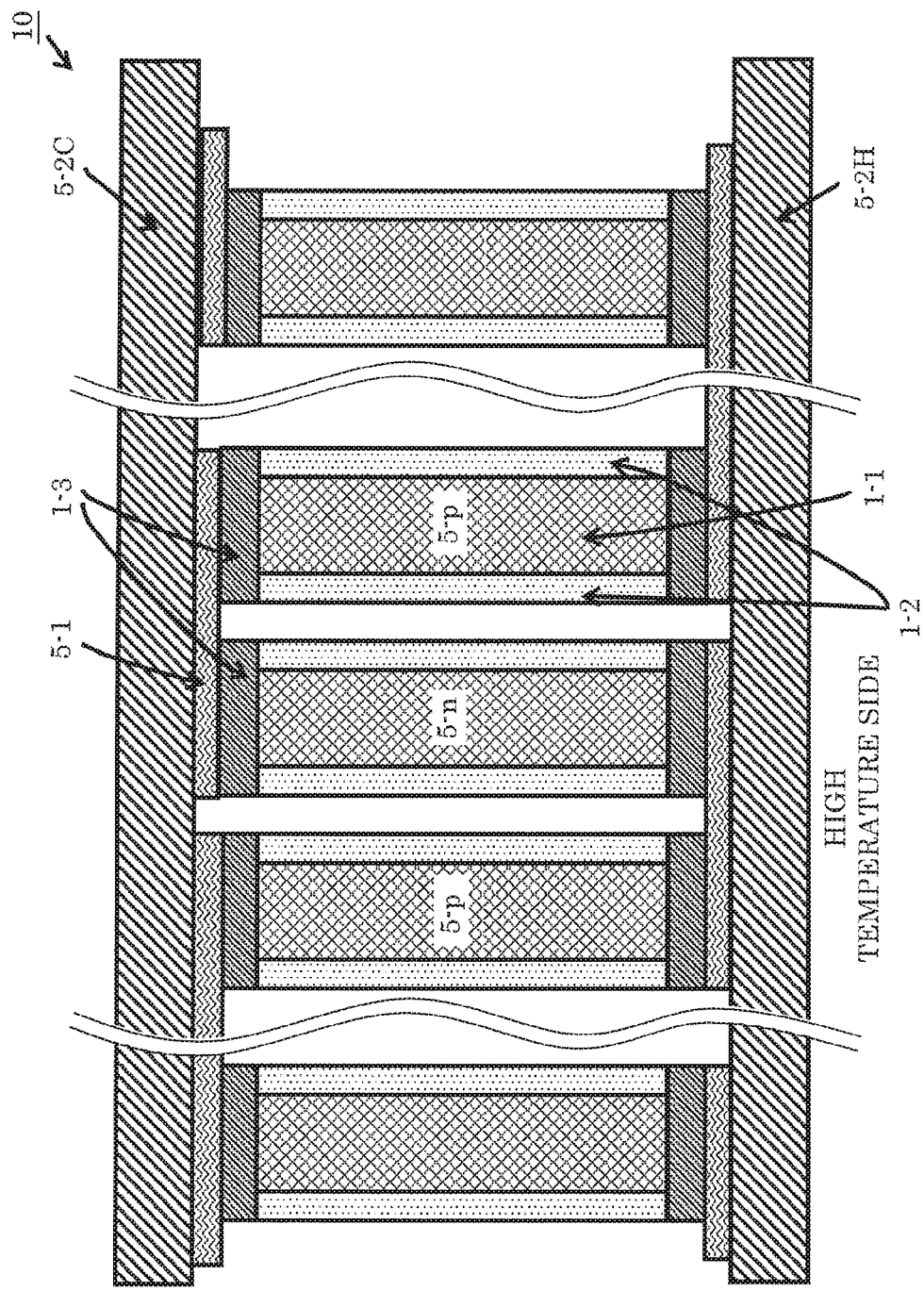
FIG. 5 is a cross-sectional view of a thermoelectric conversion module according to the embodiment.
Figure 6:
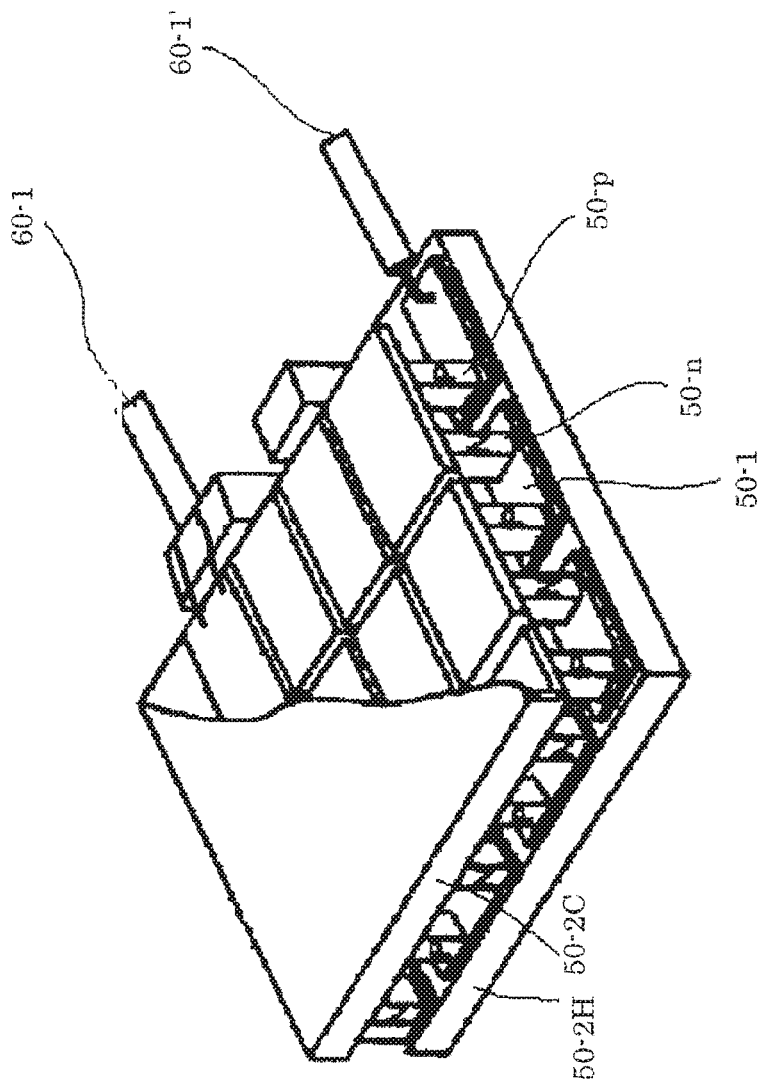
FIG. 6 is a perspective view of a conventional thermoelectric conversion module.
Figure 7:
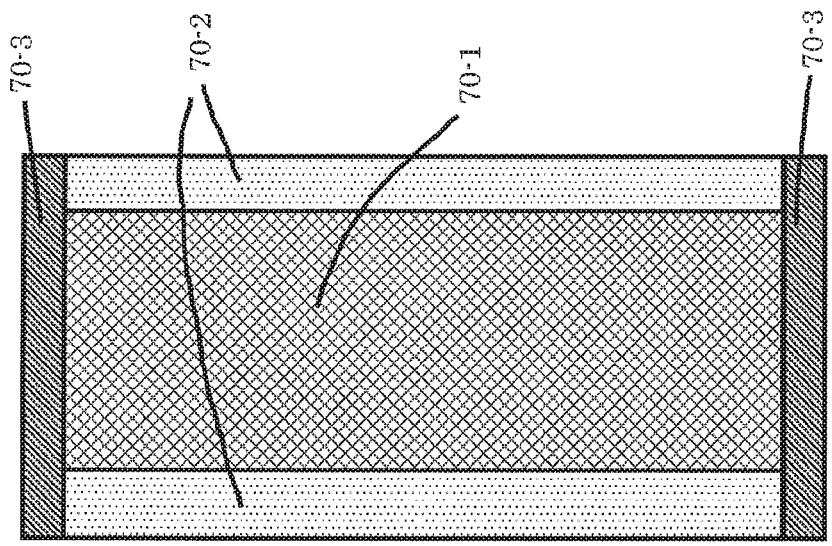
FIG. 7 is a cross-sectional view of a conventional thermoelectric conversion element.

Next, FIG. 5 illustrates thermoelectric conversion module 10 according to the present embodiment using thermoelectric conversion element 1 having the above configuration. Note that thermoelectric conversion module 10 illustrated in FIG. 5 has a π-shaped structure in which p-type thermoelectric conversion elements 5-$p$ and n-type thermoelectric conversion elements 5-$n$ each having the structure of thermoelectric conversion element 1 according to the present embodiment are arrayed in series. Here, the π-shaped structure is a structure adopted in the most common thermoelectric conversion module.

Note that in the present embodiment, the thermoelectric conversion module having the π-shaped structure is described, but the thermoelectric conversion module is not limited to the π-shaped structure, and other structures such as a half-skeleton structure and a skeleton structure are also possible, as long as the structure is determined according to various uses.

These p-type and n-type thermoelectric conversion elements are each connected to contact electrode 5-1 using a bonding material such as gold-tin (AuSn) solder or tin-silver-copper (SnAgCu) solder. Note that the bonding material depends on the usage environment of thermoelectric conversion module 10 and the manufacturing process of the set product to which thermoelectric conversion module 10 is to be applied thereafter. The material is not particularly limited as long as it enables satisfactory electrical connection.

Further, contact electrodes 5-1 are formed on low-temperature-side ceramic substrate 5-2C and high-temperature-side ceramic substrate 5-2H each of which is a wiring substrate, and are part to which copper (Cu), aluminum (Al), etc. is wired using a plating method or a vapor deposition method. Cu is common for contact electrodes 5-1 as well, but the material is not particularly limited.

Furthermore, alumina and silicon nitride are commonly used for low-temperature-side ceramic substrate 5-2C and high-temperature-side ceramic substrate 5-2H, but the material is not limited. In particular, the material is not limited to ceramics, and metal substrates such as Cu substrates or substrates having an organic substance as the main component such as epoxy substrates can be also used in the usage environment.

With these configurations, it is possible to realize high-quality thermoelectric conversion module 10 including insulator 1-2 free from cracking and chipping.

Although only one exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure can be widely applied in various technical fields when cooling is required.

What is claimed is:

1. A thermoelectric conversion element, comprising:
a thermoelectric member that is columnar and has a top end surface, a bottom end surface and a side surface between the top end surface and the bottom end surface, wherein a lengthwise direction of the thermoelectric member is a top-to-bottom direction;
an insulator formed around the thermoelectric member; and
a metal layer formed continuously on the top end surface of the thermoelectric member and an upper surface of the insulator, the upper surface of the insulator being perpendicular to the lengthwise direction, wherein:
the top end surface has an uneven surface having one or more peaks and one or more valleys,
the metal layer directly contacts and covers at least one of the one or more peaks and directly contacts and fills at least one of the one or more valleys,
an edge portion of the side surface of the thermoelectric member and an edge portion of an inner surface of the insulator define a V-shape groove covered with the metal layer, and an inner portion of the V-shape groove covered with the metal layer is a void,
in the void, the edge portion of the side surface of the thermoelectric member facing the insulator has a first point and a second point, the first point being closer to the top end surface of the thermoelectric member along the lengthwise direction of the thermoelectric member,
in the void, a first distance between the inner surface of the insulator and the first point is greater than a second distance between the inner surface of the insulator and the second point,
when the top end surface of the thermoelectric member and the upper surface of the insulator are viewed from the lengthwise direction, the V-shape groove extends along a rim of the thermoelectric member,
the metal layer includes a first metal layer, a second metal layer and a third metal layer,
the first metal layer and the second metal layer are discontinuous over the V-shape groove, and the third metal layer continuously covers the V-shape groove, and
ends of the first and second metal layers and a part of the third metal layer are exposed in the V-shape groove.

2. The thermoelectric conversion element according to claim 1, wherein
the metal layer extends into the inner portion of the V-shape groove from an edge of the top end surface of the thermoelectric member and an edge of the upper surface of the insulator.

3. The thermoelectric conversion element according to claim 1, wherein
the metal layer is formed on (i) the top end surface of the thermoelectric member, (ii) a part of the edge portion of the side surface of the thermoelectric member, and (iii) a part of the edge portion of the inner surface the insulator.

4. The thermoelectric conversion element according to claim 1, wherein
the V-shape groove includes a first portion and a second portion, the first portion being located closer to the top end surface of the thermoelectric member than the second portion is along the lengthwise direction, and having a volume greater than a volume of the second portion.

5. The thermoelectric conversion element according to claim 1, wherein:
the third metal layer is formed across the second metal layer from the thermoelectric member, and
the second metal layer has a density of nickel (Ni) higher than a density of Ni of the third metal layer.

6. The thermoelectric conversion element according to claim 5, wherein
the second metal layer has a thickness in a range of 5 nm to 1 μm.

7. The thermoelectric conversion element according to claim 5, wherein:
the first metal layer has an adhesion strength greater than an adhesion strength of a Ni layer.

8. The thermoelectric conversion element according to claim 7, wherein
the first metal layer includes titanium (Ti), molybdenum (Mo), chromium (Cr), or titanium nitride (TiN).

9. A thermoelectric conversion module, comprising:
a first wiring substrate;
a second wiring substrate opposed to the first wiring substrate; and
a plurality of thermoelectric conversion elements arrayed between the first wiring substrate and the second wiring substrate, the plurality of thermoelectric conversion elements each being the thermoelectric conversion element according to claim 1.

10. The thermoelectric conversion element according to claim 1, wherein the first distance and the second distance are measured along a direction perpendicular to the inner surface of the insulator facing the thermoelectric member.

11. The thermoelectric conversion element according to claim 10, wherein
the metal layer extends into the inner portion of the V-shape groove from an edge of the top end surface of the thermoelectric member and an edge of the upper surface of the insulator.

12. The thermoelectric conversion element according to claim 10, wherein
the metal layer is formed on (i) the top end surface of the thermoelectric member, (ii) a part of the side surface of the thermoelectric member, and (iii) a part of the inner surface of the insulator.

13. The thermoelectric conversion element according to claim 10, wherein
the V-shape groove includes a first portion and a second portion, the first portion being located closer to the top end surface of the thermoelectric member than the second portion is along the lengthwise direction, and having a volume greater than a volume of the second portion.

14. The thermoelectric conversion element according to claim 12, wherein:
the third metal layer is formed across the second metal layer from the thermoelectric member, and
the second metal layer has a density of nickel (Ni) higher than a density of Ni of the second third metal layer.

15. The thermoelectric conversion element according to claim 14, wherein
the second metal layer has a thickness in a range of 5 nm to 1 μm.

16. The thermoelectric conversion element according to claim 15, wherein:
the first metal layer has an adhesion strength greater than an adhesion strength of a Ni layer.

17. The thermoelectric conversion element according to claim 16, wherein
the first metal layer includes titanium (Ti), molybdenum (Mo), chromium (Cr), or titanium nitride (TiN).

18. A thermoelectric conversion module, comprising:
a first wiring substrate;
a second wiring substrate opposed to the first wiring substrate; and
a plurality of thermoelectric conversion elements arrayed between the first wiring substrate and the second wiring substrate, the plurality of thermoelectric conversion elements each being the thermoelectric conversion element according to claim 10.

19. The thermoelectric conversion element according to claim 2, wherein
the metal layer is in close contact with the edge portion of the side surface of the thermoelectric member.

* * * * *